US009203359B2

(12) United States Patent
Haga et al.

(10) Patent No.: US 9,203,359 B2
(45) Date of Patent: Dec. 1, 2015

(54) AMPLIFIER AND AUDIO DEVICE PROVIDED WITH AMPLIFIER

(75) Inventors: Tsuyoshi Haga, Kanagawa (JP); Seigo Ozaki, Kanagawa (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 54 days.

(21) Appl. No.: 14/000,644

(22) PCT Filed: Mar. 23, 2012

(86) PCT No.: PCT/JP2012/002057
§ 371 (c)(1),
(2), (4) Date: Aug. 21, 2013

(87) PCT Pub. No.: WO2012/132377
PCT Pub. Date: Oct. 4, 2012

(65) Prior Publication Data
US 2013/0328625 A1    Dec. 12, 2013

(30) Foreign Application Priority Data
Mar. 28, 2011    (JP) .................................. 2011-069231

(51) Int. Cl.
*H03F 3/38* (2006.01)
*H03F 3/185* (2006.01)
*H03F 3/187* (2006.01)
*H03F 3/217* (2006.01)

(52) U.S. Cl.
CPC ................ *H03F 3/185* (2013.01); *H03F 3/187* (2013.01); *H03F 3/2171* (2013.01); *H03F 3/2173* (2013.01); *H03F 3/217* (2013.01)

(58) Field of Classification Search
CPC ... G10L 19/008; H04R 29/00; H04S 2400/01; H02M 2001/0009; H03F 3/20
USPC ......................................... 330/10, 207 A, 251
See application file for complete search history.

(56) References Cited

U.S. PATENT DOCUMENTS

| 6,014,055 A * | 1/2000 | Chester ........................... 330/10 |
| 6,594,309 B1 | 7/2003 | Botti et al. |
| 7,262,658 B2 | 8/2007 | Ramaswamy et al. |
| 7,279,965 B2 * | 10/2007 | Hansen et al. .................. 330/10 |
| 7,312,654 B2 * | 12/2007 | Roeckner et al. ............... 330/10 |
| 2002/0036579 A1 | 3/2002 | Grosso et al. |

(Continued)

FOREIGN PATENT DOCUMENTS

| EP | 2 587 665 A1 | 5/2013 |
| JP | 2000-244257 A | 9/2000 |

(Continued)

OTHER PUBLICATIONS

International Search Report for PCT/JP2012/002057, May 29, 2012.

*Primary Examiner* — Khanh V Nguyen
(74) *Attorney, Agent, or Firm* — RatnerPrestia (57) ABSTRACT

Because of input of a digital signal, PWM-input, separately excited, class-D amplifier systems are less prone to be affected by noise than in the conventional case that an analog signal is input. Since a ramp wave that is synchronized with a PWM signal is used as a comparison clock, no beats occur between a PWM clock and a reference clock, making is possible to provide a class-D amplifier system which exhibits a large S/N ratio. Furthermore, the fact that an external clock can be varied provides another advantage that no beat noise occurs even in a set that is disposed close to a radio receiver.

4 Claims, 5 Drawing Sheets

(56) References Cited

U.S. PATENT DOCUMENTS

2006/0091945 A1  5/2006  Wegner
2006/0092063 A1  5/2006  Ido et al.
2007/0279126 A1  12/2007  Krishnan et al.
2008/0024210 A1  1/2008  Park

FOREIGN PATENT DOCUMENTS

| JP | 2001-522572 A | 11/2001 |
| JP | 2006-129366 A | 5/2006 |
| JP | 2009-5302 A | 1/2009 |

* cited by examiner

AMPLIFIER AND AUDIO DEVICE PROVIDED WITH AMPLIFIER

This application is a U.S. National Phase Application of PCT International Application PCT/JP2012/002057, filed Mar. 23, 2012.

TECHNICAL FIELD

The present invention relates to an amplifier and an audio device provided with the amplifier. More particularly, the invention relates to an amplifier which employs a separately excited, class-D amplification method and serves as an audio signal amplifying section as well as to an audio device provided with the amplifier.

BACKGROUND ART

PWM-input, class-D amplifiers that do not require an external clock are known as conventional amplifiers (refer to Patent document 1, for example).

In the amplifier disclosed in Patent document 1, a difference signal between a negative feedback signal from a power stage and a PWM input signal passes through two integrators and is thereby demodulated sufficiently. PWM modulation is realized without using an external clock by comparing, with a comparator, the sufficiently demodulated difference signal with a clock signal that is taken out of the first integrator and in which PWM harmonics remain.

PRIOR ART DOCUMENTS

Patent Documents

Patent document 1: U.S. Pat. No. 7,262,658

SUMMARY OF THE INVENTION

Problems to be Solved by the Invention

However, the amplifier disclosed in Patent document 1 has a problem that since a clock signal is obtained using a signal that has passed through the amplifier, amplitude differences are small and hence the S/N ratio is lowered by external noise etc.

The present invention has been made to solve the problem in the art, and an object of the invention is to provide an amplifier which does not require an external clock and can increase the S/N ratio, as well as an audio device provided with the amplifier.

Means for Solving the Problems

The invention provides an amplifier for amplifying and outputting a PCM audio signal, comprising: a PCM/PWM converter that generates a PWM signal by PWM-modulating the PCM audio signal; and a ramp wave generator that generates a ramp wave which is a reference clock for the PWM modulation performed by the PCM/PWM converter, wherein the PWM signal generated by the PCM/PWM converter and the ramp wave generated by the ramp wave generator operate in synchronism with each other.

The amplifier may be an audio signal amplifier configured by a PCM/PWM converter for PWM-modulating a PCM audio signal, a ramp wave generator for generating a ramp waveform which is synchronized with the PWM signal, an integrator which receives a difference between a PWM signal output from the PWM converter and a negative feedback signal coming from a switching power stage; a comparator for comparing an output of the integrator with the ramp waveform which is an output of the ramp wave generator and is synchronized with the PWM signal, a switching power section for amplifying a PWM waveform generated by the comparator, a demodulator for demodulating an output of the switching power section, and a negative feedback section for performing negative feedback by causing attenuation in the switching power stage.

The invention also provides an audio device in which a radio receiver for demodulating a received broadcast radio wave into a broadcast signal and an amplifier for amplifying and outputting a PCM audio signal are provided in the same housing, the amplifier includes: a PCM/PWM converter that generates a PWM signal by PWM-modulating the PCM audio signal; and a ramp wave generator that generates a ramp wave which is a reference clock for the PWM modulation performed by the PCM/PWM converter, and the PWM signal generated by the PCM/PWM converter and the ramp wave generated by the ramp wave generator operate in synchronism with each other.

Advantageous Effects of the Invention

According to the invention, in an input section of a class-D amplifier, when a signal obtained by an integrator by demodulating a PWM input wave and a negative feedback signal coming from a power stage is again modulated into a PWM signal by a comparator which uses a modulated ramp wave as a reference, the modulated ramp waveform can be made as large as possible with respect to a power voltage. Therefore, the S/N ratio of a fundamental wave is not lowered.

MODE FOR CARRYING OUT THE INVENTION

Figure 1:
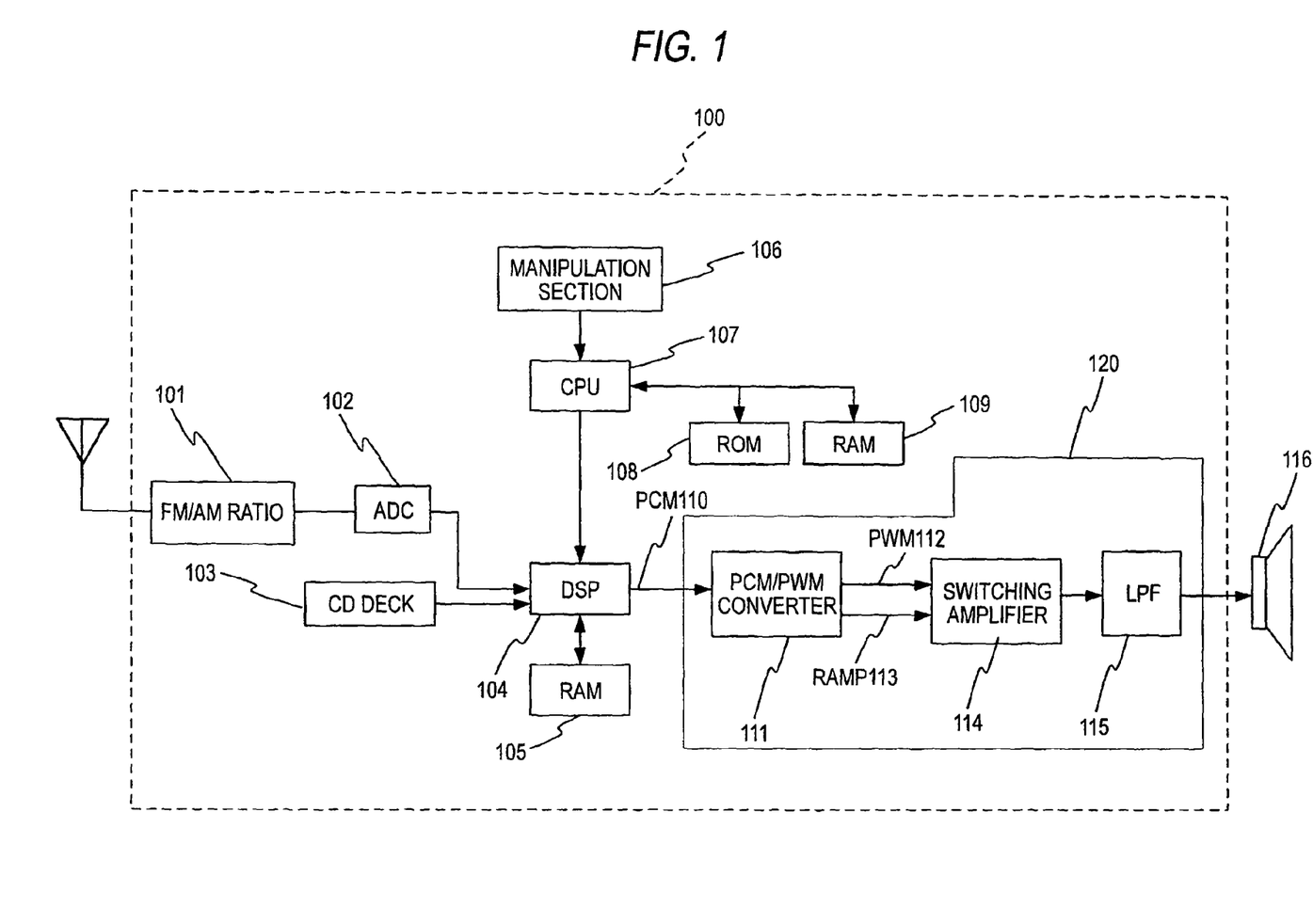
FIG. 1 is a block diagram of an audio device according to an embodiment of the present invention.

An audio device and an amplifier according to an embodiment of the present invention will be hereinafter described with reference to the drawings. FIG. 1 shows the configuration of the audio device according to the first embodiment.

As shown in FIG. 1, the audio device 100 is configured so as to be connectable to an antenna for receiving radio broadcast radio waves and a speaker for outputting an audio signal in the form of a sound.

The audio device 100 includes, as audio signal sources, a radio receiver 101 for demodulating received broadcast radio waves into a broadcast signal and a CD deck 103 for reproducing an audio signal from a recording medium such as a CD (compact disc) or a DVD (digital versatile disc) and outputting it.

The CD deck 103 reads a digital musical signal recorded on a CD with an optical pickup. The digital musical signal is output after being converted into a PCM signal.

The audio device 100 is also equipped with a manipulation section 106 which allows a user to exclusively switch between listening of an audio signal supplied from the radio receiver 101 (radio mode) and an audio signal supplied from the CD deck 103 (CD mode).

However, the manipulation section 106 need not be provided inside the audio device 100; a configuration is possible in which a manipulation signal that is transmitted from a remote controller or the like is received.

A signal that is output from the radio receiver 101 or the CD deck 103 after the radio mode or the CD mode is selected by a user manipulation is input to a DSP 104.

A PCM (pulse code modulation) signal produced by the CD deck 103 through demodulation is input to the DSP 104, a signal produced by the radio receiver 101 through demodulation is input to the DSP 104 after being converted into a PCM signal by an ADC (analog-to-digital converter) 102.

The audio device 100 is also equipped with a CPU 107 for controlling operations of the system of the audio device 100 in a unified manner, a ROM 108 for holding programs and data, and a RAM 109 for holding data temporarily. The manipulation section 106 informs the DSP 104, via the CPU 107, of a user-manipulated sound volume change or tone control change.

For example, the manipulation section 106, which is a means to be manipulated by a user to make a sound volume change or a tone control change, is composed of buttons, a rotary encoder, a variable resistor, etc.

If a user has made a manipulation for varying the sound volume using the manipulation section 106, a PCM signal that is input to the DSP 104 is multiplied by a coefficient that determines the sound volume, whereby the magnitude of the PCM signal is varied. The audio signal is given a loudness characteristic that conforms to the sound volume.

If a user has made a manipulation for varying the tone control (high-frequency range adjustment or low-frequency range adjustment) using the manipulation section 106, the frequency characteristic is varied by varying the coefficients of a digital filter which performs a calculation on a PCM signal inside the DSP 104.

An output signal that is obtained by signal processing performed by the DSP 104 according to a control signal from the CPU 107 is a PCM signal 110. The PCM signal 110 which is output from the DSP 104 is transmitted to a PCM/PWM converter 111.

The PCM/PWM converter 111 converts the PCM signal 110 which is the output of the DSP 104 into a PWM (pulse width modulation) signal 112 which is in a signal format for input to a downstream switching amplifier 114, and outputs the latter. At the same time, the PCM/PWM converter 111 outputs a ramp wave 113 to serve as a clock signal for the downstream switching amplifier 114.

The PWM signal 112 and the ramp wave 113 are modulated at the same modulation factor and output in synchronism with each other.

The switching amplifier 114 amplifies the PWM signal 112 using the ramp wave 113 as a lock signal. The PWM signal amplified by the switching amplifier 114 is converted into an analog audio signal by an LPF 115. A speaker 116 outputs a sound being driven by the analog audio signal.

If the radio mode is selected, a signal produced by the radio receiver 101 through demodulation is input to the DSP 104.

The radio receiver 101 is composed of an antenna and an AM/FM demodulation circuit. The AM/FM demodulation circuit converts a radio wave signal received by the antenna into an audio signal. During this operation, the radio receiver 101 generates beat noise if interference with a disturbance signal that is close in frequency to the carrier wave occurs.

For example, if interference occurs between an AM modulation carrier wave frequency and a frequency that is the carrier wave frequency plus $\alpha$ Hz, beats having a frequency $\alpha$ Hz are superimposed as noise on a demodulated audio signal.

A disturbance wave of $\alpha$ Hz reaches the radio receiver 101 by traveling through the air after going though the ground housing of electric circuits. Therefore, it is desired that an amplifier 120 which is disposed in the same housing as the radio receiver 101 be distant from noise sources that are used in the radio receiver 101 and whose frequencies are close (differences are within 20 kHz) to carrier wave frequencies.

That is, so that the amplifier 120 is not affected by noise coming from noise sources whose frequencies are close (differences are within 20 kHz) to carrier wave frequencies, it is desirable that the radio receiver 101 and the amplifier 120 be spaced from each other by such a distance as not to be coupled with each other electromagnetically.

However, it is physically difficult to satisfy the above requirement in the case where the radio receiver 101 and the amplifier 120 are disposed in the same housing of the audio device 100 or the radio receiver 101 and the amplifier 120 are mounted in, for example, a vehicle (even if they are separated from each other being disposed in different housing, because their installation locations are restricted).

In view of the above, in the embodiment, influences from noise sources whose frequencies are close (differences are within 20 kHz) to carrier wave frequencies are reduced by employing a configuration described below.

Figure 2:
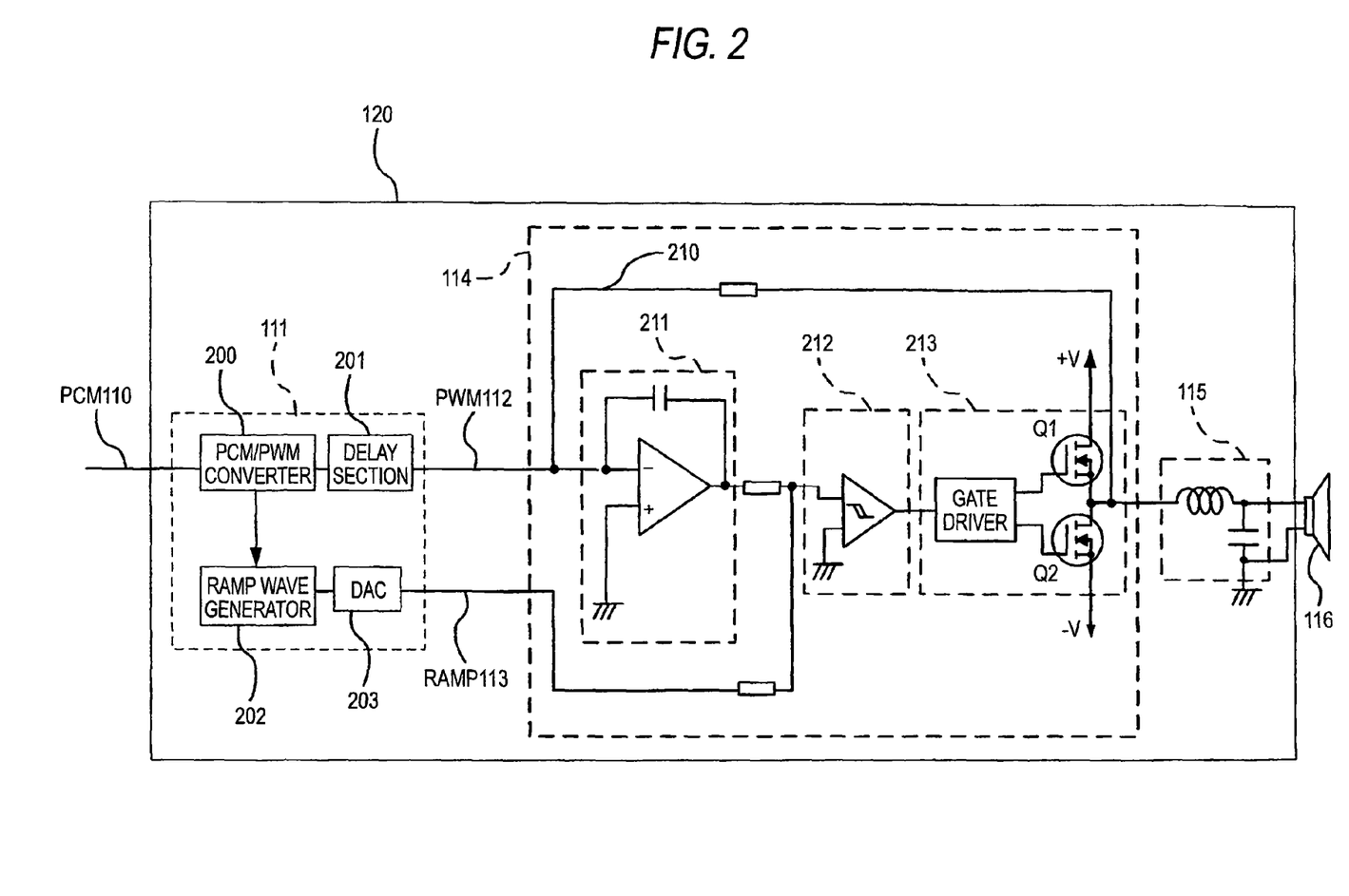
FIG. 2 is a block diagram of an amplifier according to the embodiment of the invention.

Next, the amplifier 120 will be described with reference to FIG. 2. FIG. 2 is a block diagram of the amplifier 120 according to the embodiment of the invention. As shown in FIG. 2, the amplifier 120 includes the PCM/PWM converter 111, the switching amplifier 114, and the LPF 115.

The PCM/PWM converter 111 has a PCM/PWM converter 200 and a ramp wave generator 202.

The PCM/PWM converter 200 generates a PWM signal 112 to be sent to a downstream switching power stage.

An output of the ramp wave generator 202 passes through a DAC 203, whereby a ramp wave 113 to serve as a clock signal for the downstream switching amplifier 114 is generated. The ramp wave 113 is synchronized with the PCM/PWM converter 200.

Next, the switching amplifier 114 includes an integrator 211, a comparator 212, and a power section 213 having a gate driver.

The integrator 211 receives an output signal 210 from the power section which is an output signal of the power section 213 and the PWM signal 112 which is the output of the PCM/PWM converter 111.

Since the integrator 211 operates as an LPF (lowpass filter), harmonic components are eliminated from the output signal 210 from the power section which is the output signal of the power section 213 and the PWM signal 112 which is the output of the PCM/PWM converter 111.

An output of the integrator 211 is superimposed on the ramp wave 113 which is generated by the PCM/PWM converter 111, and a resulting signal is input to the comparator 212.

The ramp wave 113 functions as a clock signal. The addition signal of the ramp wave 113 and the output of the integrator 211 are converted by the comparator 212 into a PWM signal, which is input to the power section 213.

Composed of the gate driver and FET transistors Q1 and Q2, the power section 213 performs power amplification through switching between power voltages ±V.

To enable fast switching of the FET transistors Q1 and Q2, the gate driver serves to supply and absorb currents to and from the gate terminals of the FET transistors Q1 and Q2.

An output of the power section 213 is demodulated by the LPF (lowpass filter) 115 into an audio signal, by which the speaker 116 is driven. At the same time, the output of the power section 213 is negatively fed back to the integrator 211.

Figure 3:
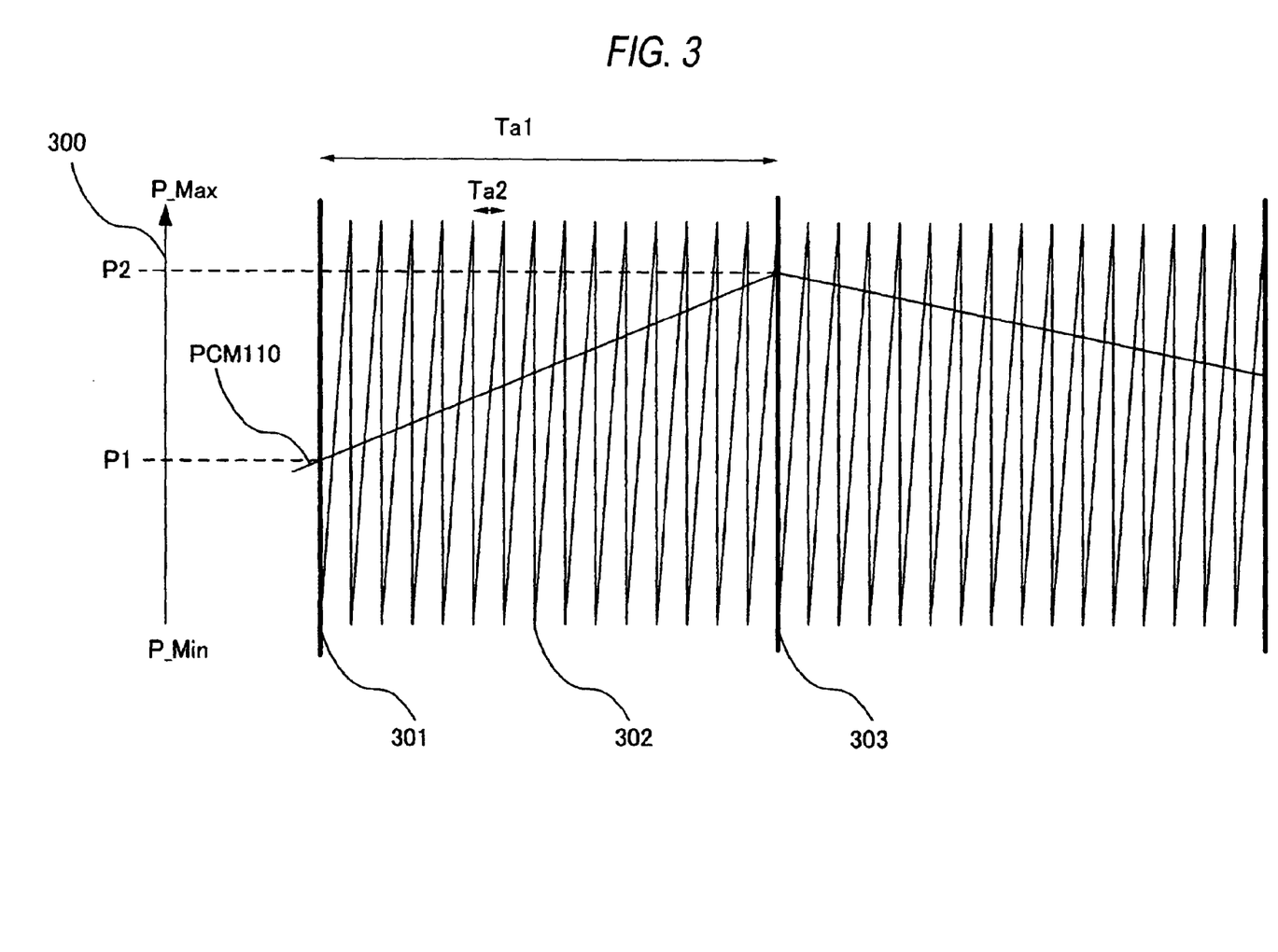
FIG. 3 roughly illustrates signal processing of a PCM/PWM converter used in the embodiment of the invention.

Next, a description will be made of how the PCM/PWM converter 200 operates. FIG. 3 roughly illustrates signal processing of the PCM/PWM converter 200 used in the embodiment of the invention.

In FIG. 3, Ta1 represents a PCM sampling cycle and P_max and P_min represent its maximum and minimum amplitude values, respectively.

In the case of the CD mode, 1/Ta1 is equal to 44.1 kHz and P_max−P_mim is equal to 16 bits. It is assumed that the PWM cycle is Ta2 and its maximum and minimum amplitude values are the same as those of the PCM signal.

The PCM/PWM converter 200 generates a waveform that interpolates values between amplitude values P1 and P2 of the PCM signal 110 at respective sampling times 301 and 303. Although straight line interpolation is employed in the example of FIG. 3, smooth spline interpolation or Lagrange interpolation may be employed.

Next, a method by which the PCM/PWM converter 200 generates a PWM signal (PWM1 waveform signal) from the PCM signal 110 and a comparison clock signal 302 will be described in detail with reference to FIG. 4. The comparison clock signal 302 is a sawtooth-wave internal reference signal which is output from an oscillator (not shown) provided inside the PCM/PWM converter 200.

Figure 4:
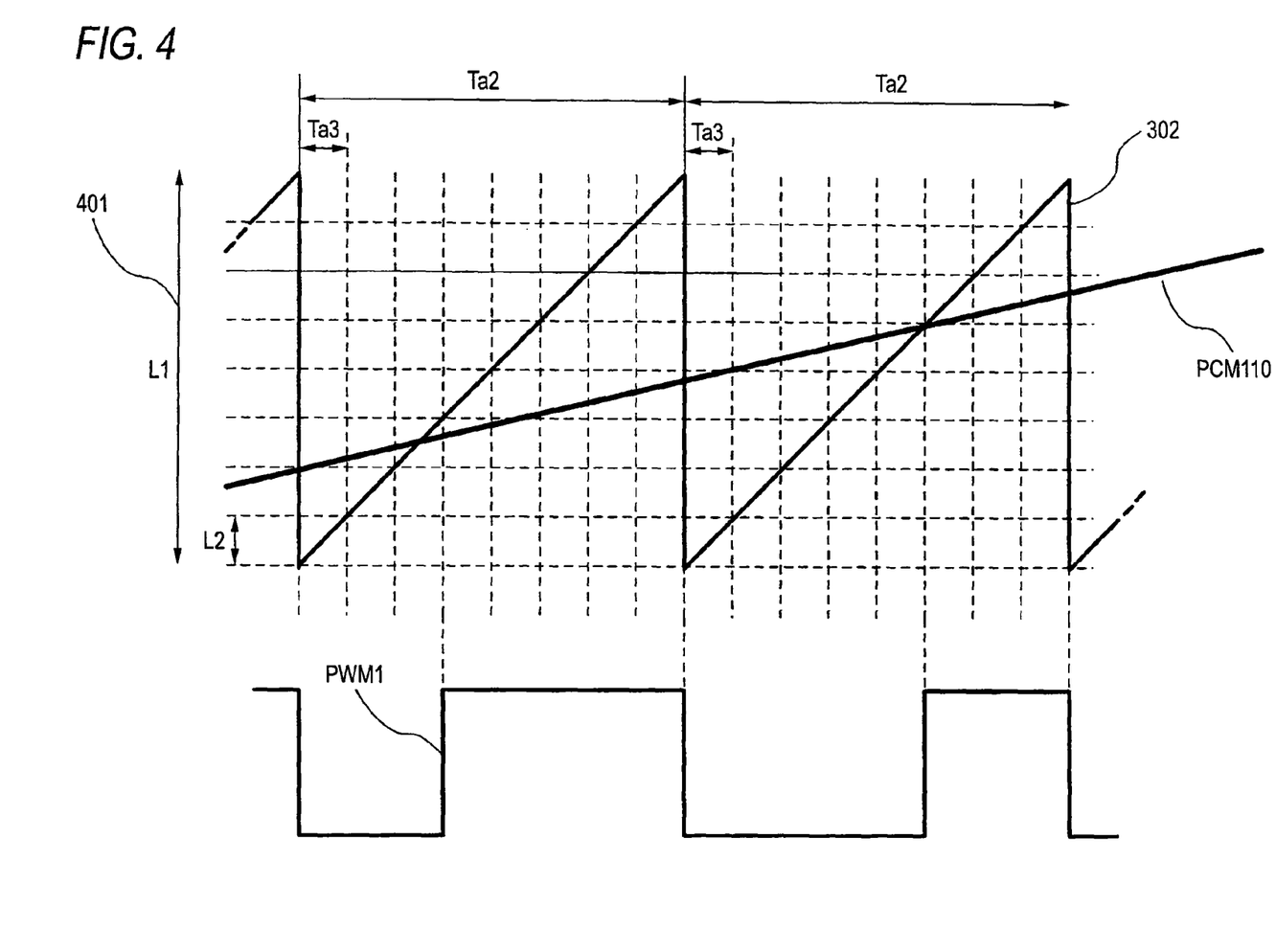
FIG. 4 illustrates, in detail, the signal processing of a PCM/PWM converter used in the embodiment of the invention.

FIG. 4 illustrates, in detail, the signal processing of the PCM/PWM converter 200 used in the embodiment of the invention.

As shown in FIG. 4, the cycle of the comparison clock signal 302 is represented by Ta2.

The PCM/PWM converter 200 generates a PWM1 waveform signal by comparing the PCM signal 110 with the comparison clock signal 302 at a cycle Ta3 that is obtained by dividing the cycle Ta2 into eight equal parts and setting the PWM1 waveform signal at a low level if the PCM signal 110 is larger than the clock signal 302 and at a high level if the PCM signal 110 is smaller than the clock signal 302. The PCM/PWM converter 200 sends the generated PWM1 waveform signal to the ramp wave generator 202.

Figure 5:
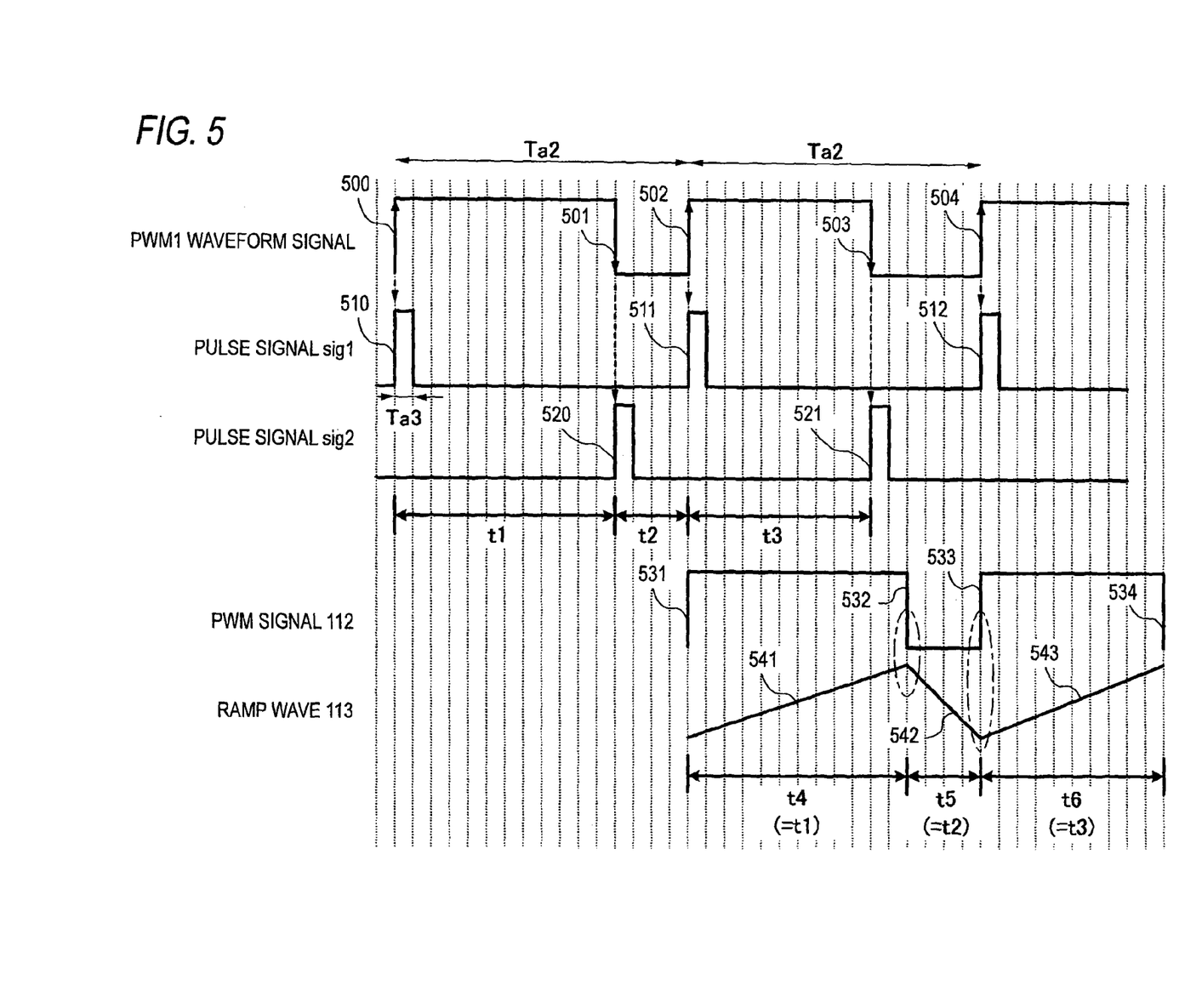
FIG. 5 illustrates signal processing of a ramp wave generator used in the embodiment of the invention.

Next, the ramp wave generator 202 will be described with reference to FIG. 5. FIG. 5 illustrates signal processing of the ramp wave generator 202 used in the embodiment of the invention.

First, the ramp wave generator 202 extracts rising edges 500, 502, and 504 of the PWM1 waveform signal acquired from the PCM/PWM converter 200 and generates a pulse signal sig1 which rises in synchronism with the extracted rising edges 500, 502, and 504 and is kept at a high level only during periods of Ta3.

Likewise, the ramp wave generator 202 extracts falling edges 501 and 503 generates a pulse signal sig2 which rises in synchronism with the extracted falling edges 501 and 503 and is kept at a high level only during periods of Ta3.

Then, the ramp wave generator 202 counts intervals (t1, t2) between rising edges of the generated pulse signals sig1 and sig2 and holds results.

When detecting the rising edge 502 of the next cycle of the PWM1 waveform signal, the ramp wave generator 202 generates a ramp waveform signal which rises and falls repeatedly so as to have the same pulse signal intervals (t4 (=t1), t5 (=t2)) as the pulse signal intervals (t1, t2) held by itself. The ramp wave generator 202 generates a digital signal having a ramp waveform (541, 542, 543) which rises and falls repeatedly and is delayed by one cycle from the PWM1 waveform signal which is acquired from the PCM/PWM converter 200, and thus outputs a ramp wave 113 through the DAC 203.

At the same time, so as to be synchronized with the ramp wave 113, the PWM1 waveform signal generated by the PCM/PWM converter 200 is delayed by a delay section 201 by one cycle (Ta2) of the PWM1 waveform signal. As a result, a PWM signal 112 which is synchronized with the ramp wave 113 is output.

As a result of the delay by the delay section 201, as indicated by chain-line ellipses in FIG. 5, the rising edges and the falling edges of the PWM signal 112 are completely synchronized with the rise/fall switching time points of the ramp wave 113. Therefore, no useless beat noise occurs in the sound frequency range and the S/N ratio of an output signal of the amplifier 120 is increased.

The ramp wave 113 serves as a clock signal for the comparator 212 of the switching amplifier 114. The S/N ratio can be increased by setting its amplitude sufficiently larger than a power voltage of the comparator 212.

As described above, the amplifier 120 according to the embodiment and the audio device 100 provided with the amplifier 120 can solve the following problems and thereby make it possible to increase the S/N ratio.

For example, self-excited amplifiers are known as circuits for realizing amplifiers (class-D amplifiers) which are high in power efficiency. Self-excited amplifiers are characterized by a negative feedback circuit which amplifies the difference between an input signal and an output signal. Because of self-oscillation, it is not necessary to input a clock externally.

However, to change the self-oscillation frequency, it is necessary to change the time constant of the negative feedback circuit. Furthermore, the oscillation frequency varies due to a variation of the amplitude of an input signal or the power voltage.

In audio device in which a radio receiver is disposed close to an amplifier, beats may occur in the audible frequency range between a fundamental wave received by the radio receiver and a clock of the amplifier.

In particular, a self-excited amplifier in which the clock frequency cannot be controlled is not suitable for an amplifier to be disposed close to a radio receiver (i.e., the radio receiver and the amplifier are disposed so as to be coupled with each other electromagnetically).

On the other hand, separately excited amplifiers are known in which the oscillation frequency can be changed easily by giving a clock to the amplifier externally. Since the oscillation frequency can be controlled from outside the amplifier, adverse influences of noise mixing on the radio receiver can be avoided. However, in the case of an analog input signal, superimposition of noise coming from a switching power stage of the amplifier tends to occur in an analog input path.

In contrast, in separately excited amplifiers which receive a PWM-modulated digital signal, it is possible to deal with a digital signal in the transmission path and binarization is performed on the reception side. Occurrence of noise in the transmission path can thus be avoided. However, in this case, demodulation into an analog signal is performed by an integrator which is located at the first stage. An external clock and an input PWM clock interfere with each other to produce beats, resulting in noise in the sound frequency range. The S/N ratio is thereby lowered.

However, in the embodiment, since a digital signal is input, the apparatus is less prone to be affected by noise than in the conventional case that an analog signal is input. Furthermore, since a ramp wave that is synchronized with a PWM signal is used as a comparison clock, no beats occur between a PWM clock and a reference clock, making is possible to realize an amplifier and an audio device which exhibit large S/N ratios.

Still further, the fact that an external clock can be varied provides another advantage that no beat noise occurs even in a set that is disposed close to the radio receiver.

That is, since no external clock that is different from a PWM input signal is necessary, no beat noise occurs. Furthermore, a ramp wave for the comparator is synchronized with a PWM signal, an amplifier and an audio device that do not cause any beats can be realized.

Although the invention has been described in detail by referring to the particular embodiment, it is apparent to those skilled in the art that various changes and modifications are possible without departing from the spirit and scope of the invention.

The present application is based on Japanese Patent Application No. 2011-069231 filed on Mar. 28, 2011, the disclosure of which is incorporated herein by reference.

INDUSTRIAL APPLICABILITY

As described above, the audio device and the amplifier according to the invention have advantages that beat noise does not occur and that beats do not occur because a ramp wave for the comparator is synchronized with a PWM signal. As such, they are useful as a separately excited, class-D amplifier as an audio signal amplifying means, an audio device having this amplifier, etc.

DESCRIPTION OF REFERENCE NUMERALS AND SIGNS

100: audio device
101: radio receiver
102: ADC
103: CD deck
104: DSP
106: manipulation section
107: CPU
108: ROM
109: RAM
110: PCM signal
111: PCM/PWM converter
112: PWM signal
113: ramp wave
114: switching amplifier
115: LPF
116: speaker
120: amplifier
200: PCM/PWM converter
201: delay section
202: ramp wave generator
203: DAC
210: output signal from power section
211: integrator
212: comparator
213: power section
300: amplitude level
301: sampling time
302: comparison clock signal
303: sampling time
401: amplitude level
500, 502, 504: rising edge
501, 503: falling edge
510, 511, 512: rise detection pulse
520, 521: fall detection pulse
531, 533: rising edge
532, 534: falling edge
541, 542, 543: ramp waveform

The invention claimed is:

1. An amplifier for amplifying a PCM audio signal, comprising:
a PCM/PWM converter that generates a first PWM signal by PWM-modulating the PCM audio signal;
a ramp wave generator that generates a ramp wave which is synchronized with the first PWM signal;
an integrator which receives the first PWM signal output from the PCM/PWM converter and receives a negative feedback signal coming from a power section; and
a comparator for comparing an output of the integrator with the ramp wave to generate a second PWM signal and outputting the second PWM signal to the power section.

2. The amplifier according to claim 1, further comprising:
a delay section that delays the first PWM signal generated by the PCM/PWM converter by one cycle of the first PWM signal.

3. The amplifier according to claim 1, wherein the ramp wave generator generates a first pulse signal which is synchronized with rises of the first PWM signal generated by the PCM/PWM converter and a second pulse signal which is synchronized with falls of the first PWM signal, and generates the ramp wave which rises and falls repeatedly at intervals between rises of the first pulse signal and the second pulse signal.

4. An audio device in which a radio receiver for demodulating a received broadcast radio wave into a broadcast signal and an amplifier for amplifying a PCM audio signal are provided in the same housing, wherein the amplifier includes:
a PCM/PWM converter that generates a first PWM signal by PWM-modulating the PCM audio signal;
a ramp wave generator that generates a ramp wave which is synchronized with the first PWM signal;
an integrator which receives the first PWM signal output from the PCM/PWM converter and receives a negative feedback signal coming from a power section; and
a comparator for comparing an output of the integrator with the ramp wave to generate a second PWM signal and outputting the second PWM signal to the power section.

* * * * *